(12) United States Patent
Kajiyama (10) Patent No.: US 6,617,658 B2
(45) Date of Patent: Sep. 9, 2003

(54) SEMICONDUCTOR MEMORY DEVICE INCLUDING MAGNETO RESISTIVE ELEMENT

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/125,485

(22) Filed: Apr. 19, 2002

(65) Prior Publication Data

US 2002/0153547 A1 Oct. 24, 2002

(30) Foreign Application Priority Data

Apr. 20, 2001 (JP) ........................................ 2001-122882

(51) Int. Cl.[7] ........................ H01L 27/108; H01L 29/76; H01L 29/94; H01L 31/119; H01L 29/82; H01L 43/00

(52) U.S. Cl. ........................................ 257/421; 257/296

(58) Field of Search ................................. 257/421–422, 257/296–310; 438/48; 365/156–158

(56) References Cited

U.S. PATENT DOCUMENTS

| 5,835,314 A | | 11/1998 | Moodera et al. | |
| 6,509,621 B2 | * | 1/2003 | Nakao | 257/421 |
| 6,515,341 B2 | * | 2/2003 | Engel et al. | 257/421 |

* cited by examiner

Primary Examiner—Cuong Quang Nguyen
(74) Attorney, Agent, or Firm—Oblon, Spivak, McClelland, Maier & Neustadt, P.C.

(57) ABSTRACT

A semiconductor memory device includes a semiconductor substrate, and a first magneto resistive element separated from the semiconductor substrate, and including a first magnetic layer and a first nonmagnetic layer. The first magnetic layer and the first nonmagnetic layer are formed in a direction perpendicular to the semiconductor substrate.

30 Claims, 5 Drawing Sheets

SEMICONDUCTOR MEMORY DEVICE INCLUDING MAGNETO RESISTIVE ELEMENT

CROSS-REFERENCE TO RELATED APPLICATION

This application is based upon and claims the benefit of priority from the prior Japanese Patent Application No. 2001-122882, filed Apr. 20, 2001, the entire contents of which are incorporated herein by reference.

BACKGROUND OF THE INVENTION

1. Field of the Invention

The present invention relates to a semiconductor memory device and a method of fabricating the same and, more particularly, to an MRAM (Magnetic Random Access Memory) using a TMR (Tunneling Magneto Resistive) element as a memory element and a method of fabricating the same.

2. Description of the Related Art

Recently, an MRAM (Magnetic Random Access Memory) cell using the tunnel magneto resistive (to be referred to as TMR hereinafter) effect as a data memory element has been proposed.

Figure 14:
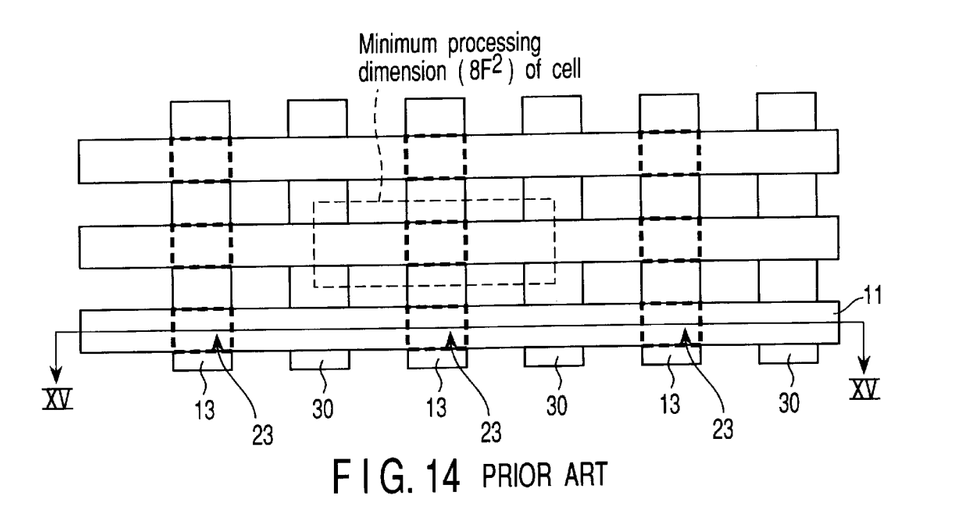
FIG. 14 is a plan view showing a semiconductor memory device according to prior art.
Figure 15:
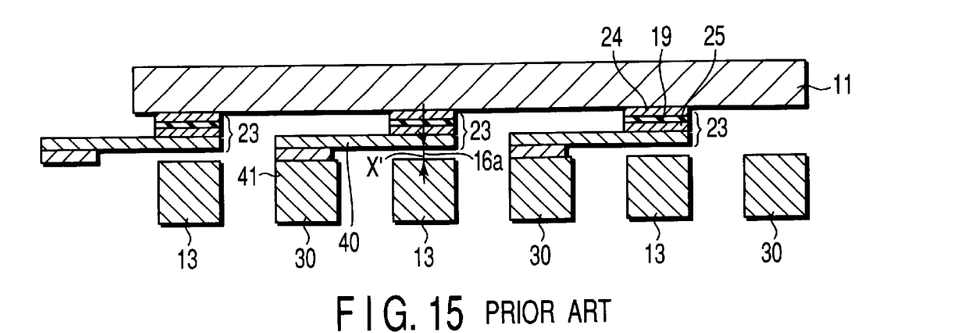
FIG. 15 is a sectional view of the semiconductor device taken along a line XV—XV in FIG. 14.
Figure 16:
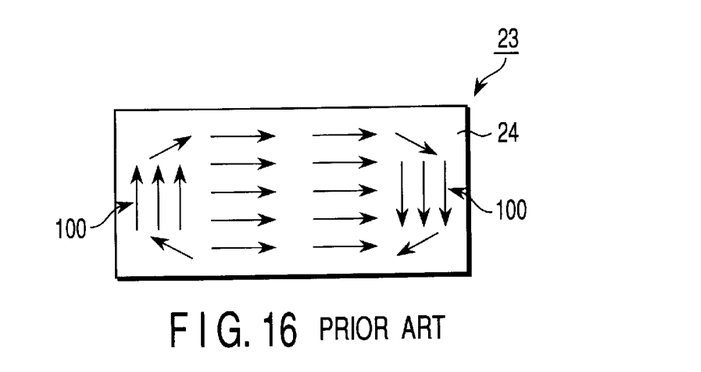
FIG. 16 is a view showing the magnetization state in a magnetic recording layer of the semiconductor memory device according to the prior art.

FIG. 14 is a plan view of a semiconductor memory device according to prior art. FIG. 15 is a sectional view of this semiconductor memory device taken along a line XV—XV in FIG. 14. FIG. 16 shows the magnetization state in a magnetic recording layer of the semiconductor memory device according to this prior art.

As shown in FIGS. 14 and 15, bit lines 11 and write word lines 13 are so formed as to cross each other at right angles. TMR elements 23 are formed at the intersections of the bit lines 11 and the write word lines 13. One end of each TMR element 23 is connected to the bit line 11, and the other end of the TMR element 23 is connected to a read word line 30 via a lower electrode 40 and a contact 41.

The TMR element 23 has a three-layered structure including two magnetic layers and a nonmagnetic layer sandwiched between these magnetic layers. That is, the TMR element 23 is composed of a magnetic recording layer 24 which connects to the bit line 11 via an upper electrode (not shown), a magnetization fixing layer 25 which connects to the lower electrode 40, and a thin tunnel insulating film 19 sandwiched between the magnetic recording layer 24 and the magnetization fixing layer 25.

This semiconductor memory device according to the prior art has the following problems.

First, the magnetic recording layer 24, the magnetization fixing layer 25, and the tunnel insulating film 19 constructing the TMR element 23 are formed in a plane parallel to a semiconductor substrate (not shown) on which this TMR element is mounted. When the TMR element 23 is patterned, therefore, the surface area of this TMR element 23 depends upon the minimum dimension of lithography. That is, the degree of freedom of processing of the TMR element 23 is low.

Also, it is originally ideal in the magnetic recording layer 24 that all the magnetization directions point in the same direction. In practice, however, as shown in FIG. 16, a magnetic domain 100 in which the magnetization vectors in the longitudinal direction turn is generated in each of the two end portions of the magnetic recording layer 24. This magnetic domain 100 generates a so-called demagnetizing field. Consequently, a region in which this demagnetizing field is generated can no longer uniformly maintain tunnel resistances corresponding to the original storage states of data "1" and "0". This problem becomes conspicuous when the TMR element 23 is downsized. That is, to downsize the area component, which is parallel to the semiconductor substrate, of the TMR element 23, the surface area of the TMR element 23 must be decreased. More specifically, as the surface area of the TMR element 23 decreases, the proportion of the magnetic field unstable region generated by the magnetic domain 100 in the end portion of the TMR element 23 increases. This makes it difficult to detect a difference in change amount between the tunnel resistances. Additionally, downsizing of the film thickness component, which is perpendicular to the semiconductor substrate, of the TMR element 23 is more difficult than downsizing of the area component of the TMR element 23. Therefore, if downsizing of the area component of the TMR element 23 is advanced, a magnetic field required for switching increases, and this extremely increases an applied current when the magnetic field is generated. As described above, since downsizing of the TMR element 23 is difficult, downsizing of a cell is also difficult.

Furthermore, as shown in FIG. 15, the conventional cell requires one bit line 11 and two word lines (the write word line 13 and the read word line 30) for each TMR element 23. In addition, to connect the TMR element 23 to the read word line 30, wiring must be extracted by using the lower electrode 40, the contact 41, and the like. Accordingly, the existence of various wiring and the like increases the minimum processing dimension of the cell to $8F^2$ or more (FIG. 14). This further makes downsizing of the cell difficult.

Also, as shown in FIG. 15, as a distance X' between the write word line 13 and the TMR element 23 is shortened, the write current decreases, and this improves the operation margin. Hence, it is necessary to shorten this distance X' between the write word line 13 and the TMR element 23. However, it is very difficult in view of process to perform control such that a film thickness 16a of the insulating film between the write word line 13 and the TMR element 23 decreases.

As described above, in the semiconductor memory device according to the above prior art, the degree of freedom of the surface processing of the TMR element 23 is low, downsizing of the cell area is difficult, and control of the distance X' between the write word line 13 and the TMR element 23 is difficult.

BRIEF SUMMARY OF THE INVENTION

According to a first aspect of the present invention, a semiconductor memory device comprises a semiconductor substrate, and a first magneto resistive element separated from the semiconductor substrate, the first magneto resistive element comprising a first magnetic layer and a first nonmagnetic layer, the first magnetic layer and the first nonmagnetic layer being formed in a direction perpendicular to the semiconductor substrate.

According to a second aspect of the present invention, a method of fabricating a semiconductor memory device, comprises forming first wiring above a semiconductor substrate, forming a first insulating film on the first wiring, forming second and fourth wiring on the first insluting film, the fourth wiring being formed away from the second wiring with a first space therebetween, partially forming a second insulating film on the first insulating film and on the second and fourth wiring to form a first trench in the first space, forming first and second magneto resistive elements on two side surfaces of the first trench, the first magneto resistive element comprising a first magnetic layer and a first nonmagnetic layer, the first magnetic layer and the first nonmagnetic layer being formed in a direction perpendicular to the semiconductor substrate, the second magneto resistive element comprising a second magnetic layer and a second nonmagnetic layer, and the second magnetic layer and the second nonmagnetic layer being formed in the direction perpendicular to the semiconductor substrate, removing the first insulating film from a bottom surface of the first trench between the first and second magneto resistive elements to form a contact hole which exposes a portion of the first wiring, and removing a portion of the second insulating film which are positioned above the second and fourth wiring to form second and third trenches, forming a contact in the contact hole, the contact being connected to the first wiring and to the first and second magneto resistive elements, and forming third and sixth wiring in the second and third trenches, respectively, the third wiring being connected to the first magneto resistive element, and the sixth wiring being connected to the second magneto resistive element.

DETAILED DESCRIPTION OF THE INVENTION

Embodiments of the present invention relate to an MRAM (Magnetic Random Access Memory) using a TMR (Tunneling Magneto Resistive) element as a memory element, in which this TMR element is formed as a so-called vertical element.

Embodiments of the present invention will be described below with reference to the accompanying drawing. In the following explanation, the same reference numerals denote the same parts throughout the drawing.

[First Embodiment]

In the first embodiment, a TMR element is formed as a so-called vertical element, and this TMR element and a contact continue over a plurality of cells in a direction parallel to write word lines.

Figure 1:
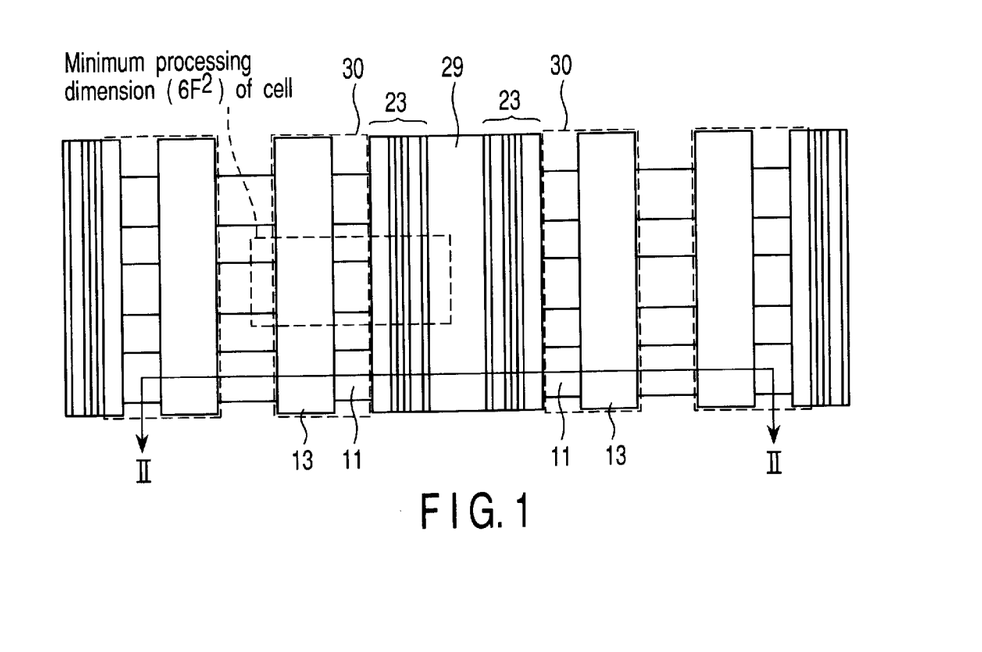
FIG. 1 is a plan view showing a semiconductor memory device according to the first embodiment of the present invention.
Figure 2:
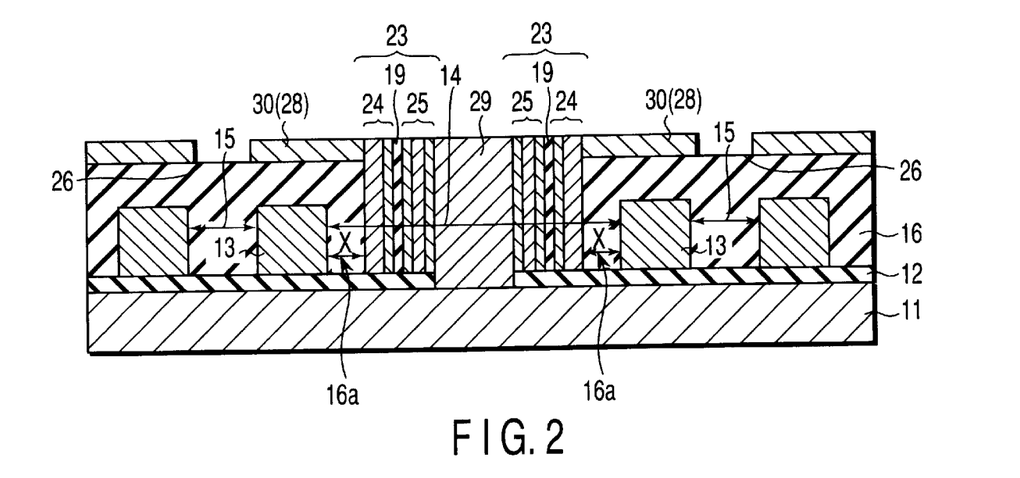
FIG. 2 is a sectional view of the semiconductor memory device taken along a line II—II in FIG. 1.

FIG. 1 is a plan view of a semiconductor memory device according to the first embodiment of the present invention. FIG. 2 is a sectional view of this semiconductor memory device taken along a line II—II in FIG. 1.

As shown in FIGS. 1 and 2, the semiconductor memory device according to the first embodiment uses a TMR element 23 having, e.g., a single tunnel junction structure as a memory element. This single tunnel junction structure TMR element 23 is composed of a magnetic recording layer 24 (magnetic layer), a magnetization fixing layer (magnetic layer) 25, and a tunnel insulating film (nonmagnetic layer) 19 sandwiched between the magnetic recording layer 24 and the magnetization fixing layer 25.

Bit lines 11 are selectively formed above a semiconductor substrate (not shown), and a first insulating film 12 is formed on the bit lines 11. On this first insulating film 12, write word lines 13 are selectively formed in a direction different from the direction in which the bit lines 11 run. These word lines 13 are formed by alternately forming a first space 14 and a second space 15 narrower than the first space 14. A second insulating film 16 is formed on the side surfaces of the write word lines 13 between which the first space 14 is formed, in the entire second spaces 15, and on the top surfaces of the write word lines 13. The TMR elements 23 are formed on the side surfaces of the second insulating film 16 formed on the side surfaces of the write word line 13 between which the first space 14 is formed. Between these TMR elements 23, a contact 29 connecting to the bit line 11 is formed parallel to the TME elements 23. In addition, on those portions of the top surface of the second insulating film 16 which are present above the write word lines 13, read word lines 30 are formed in the same direction as the extension of the write word lines 13. These read word lines 30 are connected to the TMR elements 23.

Each TMR element 23 is formed as a so-called vertical element. That is, the magnetic recording layer 24, the magnetization fixing layer 25, and the tunnel insulating film 19 constructing this TMR element 23 are formed perpendicular to the semiconductor substrate. Also, over a plurality of cells, the TMR elements 23 and the contact 29 extend in the direction in which the write word lines 13 run. Furthermore, those stacked structures of the adjacent TMR elements 23, which include the magnetic recording layer 24, the magnetization fixing layer 25, and the tunnel insulating film 19, are axially symmetrical with respect to the boundary between these TMR elements.

In this semiconductor memory device according to the first embodiment, a write operation to the TMR element 23 is performed in a portion sufficiently close to the write word line 13 and the bit line 11, at the intersection of these word line 13 and bit line 11. Therefore, even when the upper and lower electrodes (the magnetic recording layer 24 and the magnetization fixing layer 25) and the tunnel insulating film 19 of the TMR element 23 and the bit line contact 29 continue in the direction of the word lines 13, a signal change to be written can be well read out.

Figure 3:
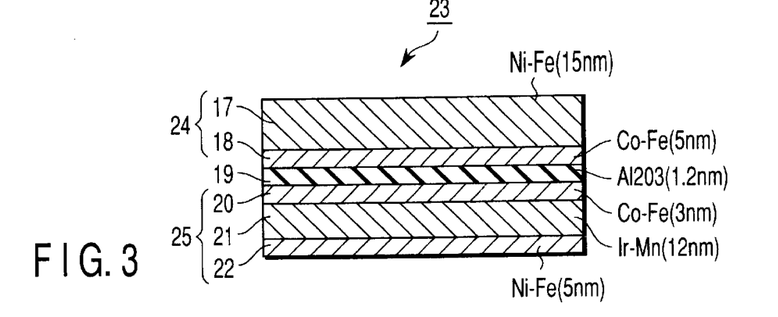
FIG. 3 is a sectional view of a TMR element having a single tunnel junction structure according to the first and second embodiments of the present invention.

FIG. 3 is a sectional view of a TMR element having a single tunnel junction structure according to each embodiment of the present invention. The structure of this single tunnel junction structure TMR element 23 will be described below.

As shown in FIG. 3, the single tunnel junction structure TMR element 23 includes a magnetic recording layer 24, a magnetization fixing layer 25, and a tunnel insulating film 19. The magnetic recording layer 24 is composed of a protective layer 17 having a thickness of, e.g., 15 nm and a ferromagnetic layer 18 having a thickness of, e.g., 5 nm. The magnetization fixing layer 25 is composed of a ferromagnetic layer 20 having a thickness of, e.g., 3 nm, an anti-ferromagnetic layer 21 having a thickness of, e.g., 12 nm, and an underlayer 22 having a thickness of, e.g., 5 nm. The thickness of the tunnel insulating film 19 is, e.g., 1.2 nm.

Examples of the materials of this TMR element 23 are, as shown in FIG. 3, Ni—Fe as the protective layer 17, Co—Fe as the ferromagnetic layer 18, $Al_2O_3$ as the tunnel insulating film 19, Co—Fe as the ferromagnetic layer 20, Ir—Mn as the anti-ferromagnetic layer 21, and Ni—Fe as the underlayer 22.

Note that the materials of the TMR element 23 are not restricted to those described above, and it is also possible to use the following materials.

Preferred examples of the materials of the magnetic recording layer 24 and the magnetization fixing layer 25 are Fe, Co, Ni, and their alloys, magnetite having a large spin polarizability, oxides such as $CrO_2$ and $RXMnO_{3-y}$ (R; rare earth element, X; Ca, Ba, or Sr), and Heusler alloys such as NiMnSb and PtMnSb. Nonmagnetic elements such as Ag, Cu, Au, Al, Mg, Si, Bi, Ta, B, C, O, N, Pd, Pt, Zr, Ir, W, Mo, and Nb can also be more or less contained in these magnetic substances, provided that ferromagnetism is not lost.

As the material of the anti-ferromagnetic layer 21 forming part of the magnetization fixing layer 25, it is preferable to use Fe—Mn, Pt—Mn, Pt—Cr—Mn, Ni—Mn, NiO, or $Fe_2O_3$.

As the material of the tunnel barrier layer 19, it is possible to use various dielectric substances such as $SiO_2$, MgO, AlN, $Bi_2O_3$, $MgF_2$, $CaF_2$, $SrTiO_2$, and $AlLaO_3$. Oxygen, nitrogen, and fluorine deficiency can exist in these dielectric substances.

In the first embodiment, the single tunnel junction structure TMR element 23 is used as a memory element. However, a TMR element having a double tunnel junction structure can also be used as a memory element.

Figure 4:
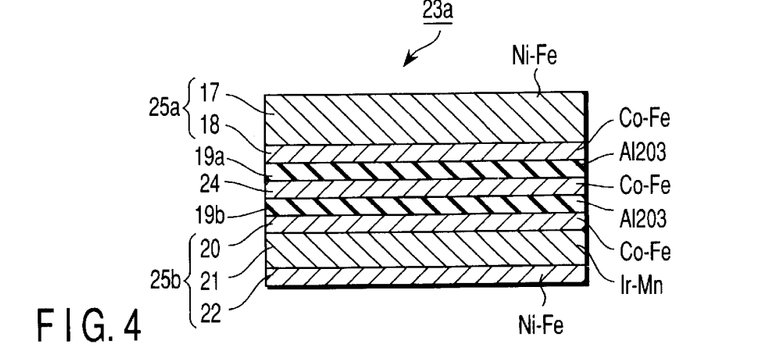
FIG. 4 is a sectional view of a TMR element having a double tunnel junction structure according to the first and second embodiments of the present invention.

FIG. 4 is a sectional view showing a double tunnel junction structure TMR element according to each embodiment of the present invention. The structure of this double tunnel junction structure TMR element will be explained below.

As shown in FIG. 4, this double tunnel junction structure TMR element 23a includes a magnetic recording layer 24, first and second magnetization fixing layers 25a and 25b, and first and second tunnel insulating films 19a and 19b. The first magnetization fixing layer 25a is composed of a protective layer 17 and a ferromagnetic layer 18. The second magnetization fixing layer 25a is composed of a ferromagnetic layer 20, an anti-ferromagnetic layer 21, and an underlayer 22.

Examples of the materials of this TMR element 23a are, as shown in FIG. 4, Ni—Fe as the protective layer 17, Co—Fe as the ferromagnetic layer 18, $Al_2O_3$ as the first and second tunnel insulating films 19a and 19b, Co—Fe as the ferromagnetic layer 20, Ir—Mn as the anti-ferromagnetic layer 21, Ni—Fe as the underlayer 22, and Co—Fe as the magnetic recording layer 24.

Note that the materials of the TMR element 23a are not limited to those described above, and it is also possible to use the materials explained in the aforementioned single tunnel junction structure.

FIGS. 5 to 12 are sectional views of fabrication steps of the semiconductor memory device according to the first embodiment of the present invention. A method of fabricating the semiconductor memory device according to the first embodiment will be described below with reference to FIGS. 5 to 12. Note that this fabrication method will be explained by taking a single tunnel junction structure TMR element as an example.

Figure 5:
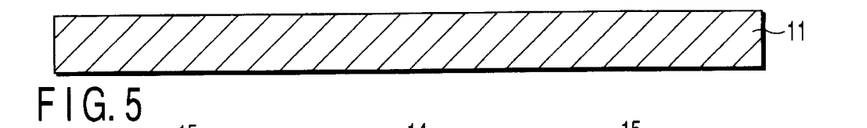
FIG. 5 is a sectional view showing a fabrication step of the semiconductor memory device according to the first embodiment of the present invention.

First, as shown in FIG. 5, a metal material for bit line formation is deposited on an insulating film (not shown) formed on a semiconductor substrate (not shown). A bit line 11 is formed by patterning this metal material.

Figure 6:
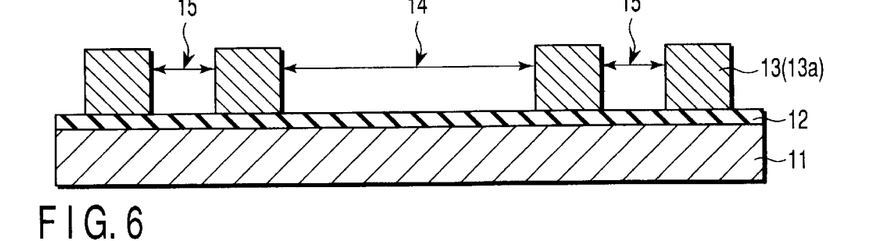
FIGS. 6, 7, 8, 9, 10, 11 and 12 are sectional views showing fabrication steps of the semiconductor memory device according to the first embodiment of the present invention.

Next, as shown in FIG. 6, a first insulating film 12 is formed on the bit line 11, and a metal material 13a for word line formation is deposited on this first insulating film 12. Write word lines 13 are formed by pattering the metal material 13a by using a mask material. As a consequence, a first space 14 and second spaces 15 are formed between the write word lines 13. The first space 14 is a wide space, and the second spaces 15 are narrower than this first space 14. Also, the first space 14 is used to form TMR elements 23 and a contact 29 to be described later. The second space 15 is a space between cells, and the dimension of this second space 15 is, e.g., a minimum dimension.

Figure 7:
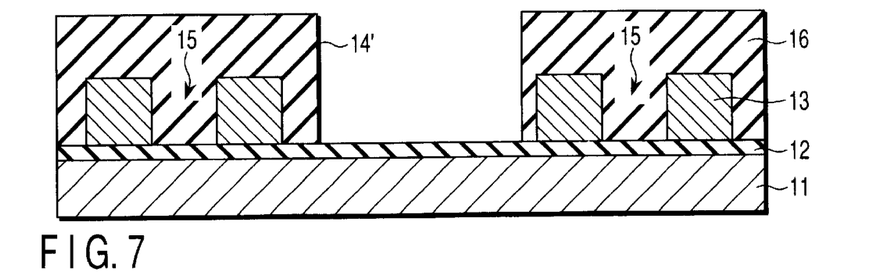

As shown in FIG. 7, a second insulating film 16 is deposited on the write word lines 13 and the first insulating film 12, and is planarized. In this planarization, the film thickness of the second insulating film 16 is so adjusted that the second spaces 15 are filled and the first space 14 is not filled. As a consequence, a first trench 14' is formed in the first space 14.

Figure 8:
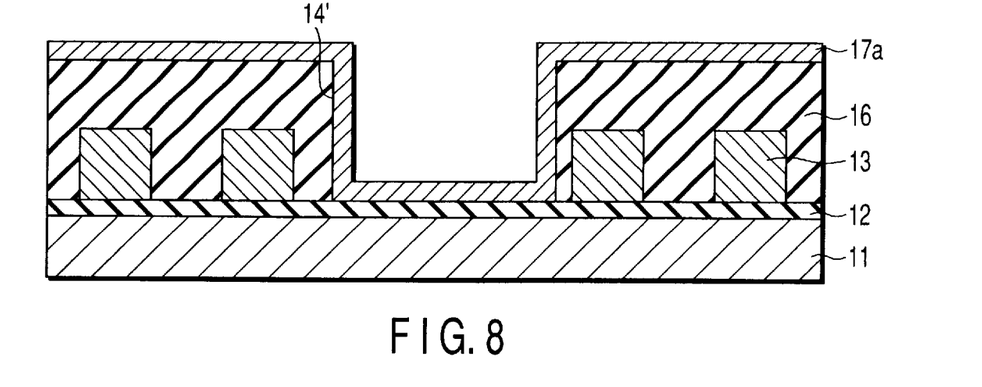
Figure 9:
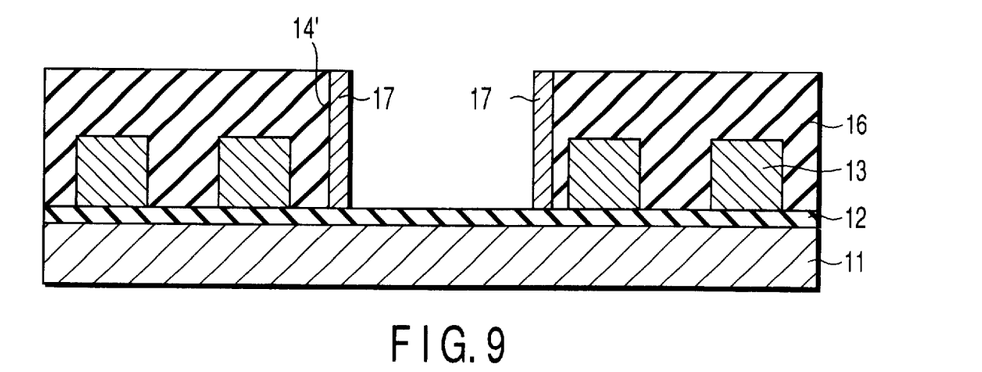

As shown in FIG. 8, a protective layer 17 is formed on the first and second insulating films 12 and 16. After that, as shown in FIG. 9, this protective film 17 is removed by RIE (Reactive Ion Etching) to expose the surfaces of the first and second insulating films 12 and 16. Accordingly, the protective layer 17 remains only on the two side surfaces of the first trench 14'.

Figure 10:
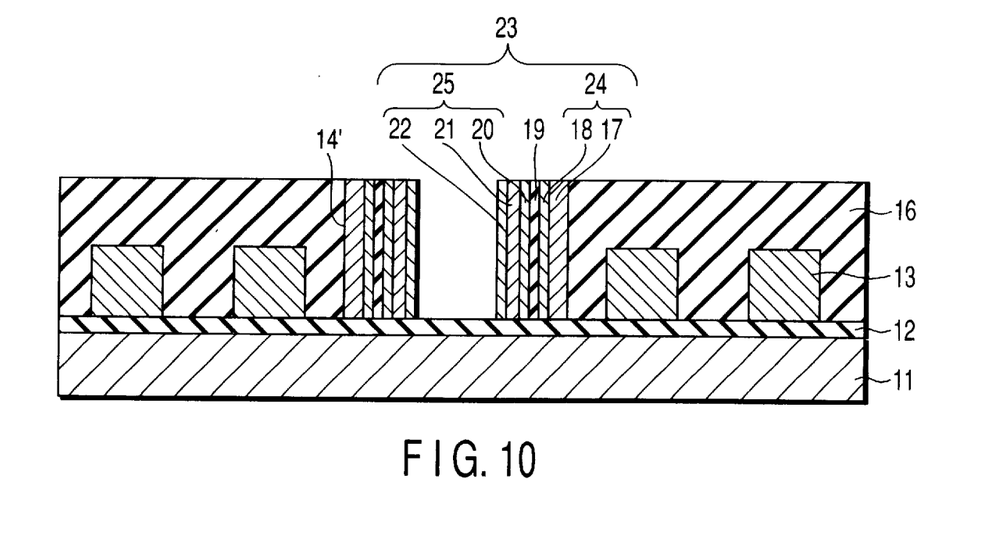

As shown in FIG. 10, the steps shown FIGS. 8 and 9 are repeated to sequentially form a ferromagnetic layer 18, a tunnel insulating film 19, a ferromagnetic layer 20, an anti-ferromagnetic layer 21, and an underlayer 22, thereby forming TMR elements 23 on the two side surfaces of the first trench 14'. In each TMR element 23, the protective layer 17 and the ferromagnetic layer 18 form a magnetic recording layer 24, and the ferromagnetic layer 20, the anti-ferromagnetic layer 21, and the underlayer 22 form a magnetization fixing layer 25.

Figure 11:
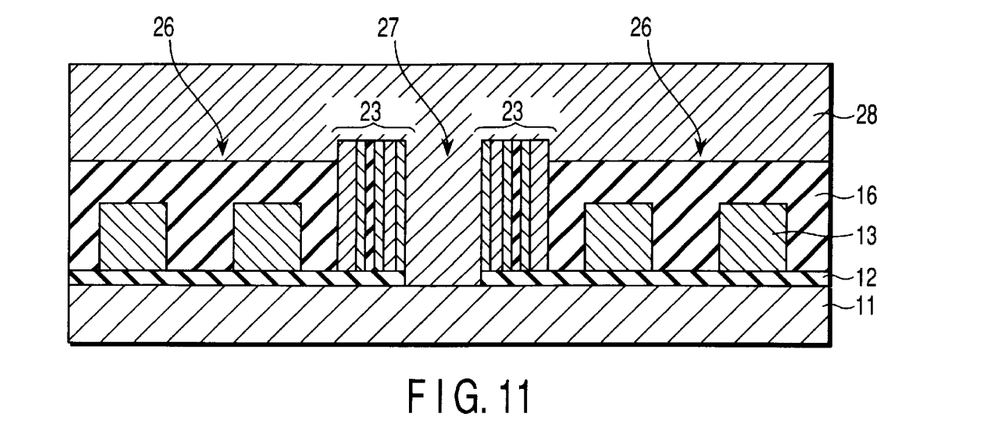

As shown in FIG. 11, etch back is performed to remove the second insulating film 16 on the write word lines 13 by an amount corresponding to the film thickness of read word lines 30 to be described later. At the same time, the first insulating film 12 on the bottom surface between the TMR elements 23 is removed until the surface of the bit line 11 is exposed. Consequently, second trenches 26 and a contact hole 27 are formed. In order not to remove the whole second insulating film 16 on the write word lines 13, the mask material (not shown) used when these write word lines 13 are patterned is preferably left behind.

Subsequently, a metal material (W) 28 for forming read word lines 30 and a contact 29 is deposited in the second trenches 26 and on the TMR elements 23. This metal material 28 fills the second trenches 26 and the contact hole 27.

Figure 12:
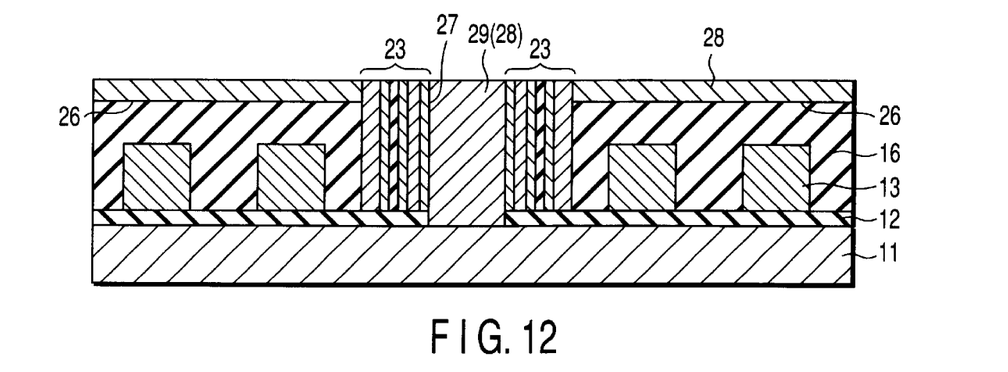

As shown in FIG. 12, etch back or CMP (Chemical Mechanical Polishing) is performed to remove the metal material 28 by using the TMR elements 23 as stoppers, thereby exposing these TMR elements 23. As a consequence, a contact 29 connecting to the TMR elements 23 and the bit line 11 is formed in the contact hole 27.

Finally, as shown in FIG. 2, the metal material 28 in the second trenches 26 is patterned by lithography, RIE, and the like, thereby forming read word lines 30 connecting to the TMR elements 23.

In the above first embodiment, the TMR element 23 is formed as a so-called vertical element. That is, the magnetic recording layer 24, the magnetization fixing layer 25, and the tunnel insulating film 19 forming this TMR element 23 are formed perpendicular to the semiconductor substrate. The first embodiment with this arrangement achieves the following effects.

First, since the TMR element 23 is formed vertically, this TMR element 23 can be given a desired pattern by sequentially stacking the layers constructing the TMR element 23 on a side surface of the first trench 14'. That is, the TMR element 23 need not be patterned using lithography and RIE unlike in the conventional methods, so the surface area of this TMR element 23 is no longer restricted by the processing limit of lithography. This can improve the degree of freedom of processing of the TMR element 23.

Also, since the degree of freedom of processing of the TMR element 23 can be improved as described above, the surface area of this TMR element 23 can be made larger than the minimum dimension. More specifically, the aspect ratio of the write word line 13 is increased, and a material (e.g., polysilicon) which can be easily buried is used as the metal material 28 for forming the contact 29. Since the surface area of the TMR element 23 can thus be made larger than the minimum dimension, the proportion of a magnetic field unstable region formed by the magnetic domain 100 generated in each end portion of the TMR element 23 can be decreased. Accordingly, a difference in change amount between tunnel resistances can be detected more easily than in the conventional methods. This can avoid the problem that a magnetic field required for switching increases and this extremely increases an applied current when the magnetic field is generated.

Since the TMR element 23 is vertically formed, the read word line 30 can be directly connected to this TMR element 23. This obviates the need for wiring connecting the TMR element 23 and the read word line 30 unlike in the convention memories. Accordingly, the cell can be made smaller than the conventional cells. Consequently, the minimum processing dimension of the cell area per cell can be decreased to $6F^2$, and this achieves cells smaller than the conventional cells.

The second insulating film 16 between the write word line 13 and the TMR element 23 is deposited in self-alignment on the side walls of the write word line 13. Therefore, the second insulating film thickness 16a which determines the distance X between the write word line 13 and the TMR element 23 is substantially equal to the deposited film thickness and is hardly subject to the influence of any other variation factors. That is, since the distance X between the write word line 13 and the TMR element 23 can be readily made shorter than in the conventional memories, the operation margin can be improved. In addition, the contact 29 between the two TMR elements 23 can absorb variations in the dimensions of the write word lines 13, variations in the film thickness 16a of the second insulating film between the write word line 13 and the TMR element 23, and variations in the film thicknesses of the layers constructing the TMR element 23.

When the double tunnel junction structure TMR element 23a is used in the first embodiment, this double tunnel junction structure TMR element 23a produces less deterioration of the MR (Magneto Resistive) ratio (a change in resistance between "1" and "0" states), for the same external bias applied, and hence can operate at a higher bias than when the single tunnel junction structure TMR element 23 is used. That is, the use of the double tunnel junction structure TMR element 23a is advantageous in reading out information from inside a cell to the outside.

[Second Embodiment]

In the second embodiment, a TMR element is formed vertically, and this TMR element and a contact are divided in units of cells.

Figure 13:
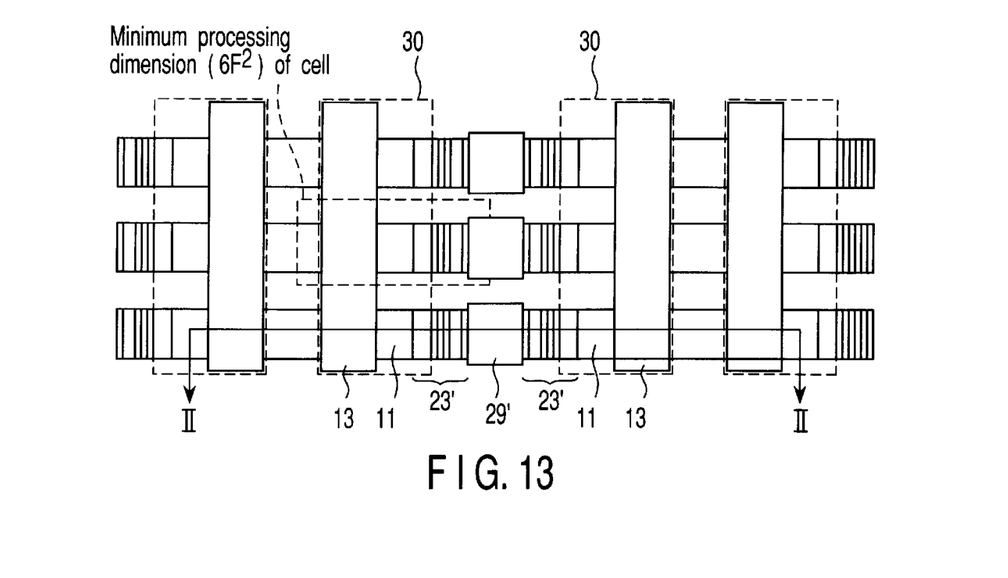
FIG. 13 is a plan view showing a semiconductor memory device according to the second embodiment of the present invention.

FIG. 13 is a plan view of a semiconductor memory device according to the second embodiment of the present invention. A sectional view taken along a line II—II in FIG. 13 is the same as the semiconductor memory device according to the first embodiment shown in FIG. 2. In this second embodiment, a description of the same structures as in the first embodiment will be omitted, and only a different structure will be explained.

As shown in FIG. 13, in this semiconductor memory device according to the second embodiment, a TMR element 23' and a contact 29' connecting this TMR element 231 to a bit line 11 do not continue in the direction of write word lines 13 but are divided in units of cells. Note that only one of the TMR element 23' and the contact 29' can also be divided in units of cells.

As in the first embodiment described above, a single tunnel junction structure as shown in FIG. 3 or a double tunnel junction structure as shown in FIG. 4 is applied to this second embodiment.

A method of fabricating the semiconductor memory device according to the second embodiment of the present invention will be briefly described below. In this second embodiment, a description of the same steps as in the first embodiment will be omitted, and only different steps will be explained.

First, as shown in FIGS. 5 to 12, TMR elements 23 are formed in the same manner as in the first embodiment.

Next, as shown in FIG. 2, when read word lines 30 are lithographed the TMR elements 23 and a bit line contact 29 are patterned into shapes shown in FIG. 13. Since the TMR elements 23 and the contact 29 are etched on steps deeper than the read word lines 30, processing must be so performed that no etching residue remains. Therefore, it is necessary to use etching conditions under which high etching selectivity to a second insulating film 16 below the read word lines 30 is obtained. In this way, TMR elements 23' and contacts 29' divided in units of cells are formed.

The above second embodiment can achieve the same effects as in the first embodiment.

In addition, when the TMR elements 23' are separated in units of cells as in the second embodiment, it is possible to prevent a magnetic field unstable region generated by variations in a parasitic current and in a demagnetizing field from adversely affecting all cells.

In each of the above embodiments, a TMR element is used as a memory element. However, instead of this TMR element it is also possible to use a GMR (Giant Magneto Resistive) element made up of two magnetic layers and a conductor layer sandwiched between these magnetic layers.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor memory device comprising:
   a semiconductor substrate; and
   a first magneto resistive element separated from said semiconductor substrate, said first magneto resistive element comprising a first magnetic layer and a first nonmagnetic layer, said first magnetic layer and said first nonmagnetic layer being formed in a direction perpendicular to said semiconductor substrate.

2. A semiconductor memory device according to claim 1, wherein said first magneto resistive element continues over a plurality of cells.

3. A semiconductor memory device according to claim 1, wherein said first magneto resistive element is divided in units of cells.

4. A semiconductor memory device according to claim 1, further comprising:
   first wiring which is separated from said semiconductor substrate and extends in a first direction; and
   second wiring which is separated from said first wiring and extends in a second direction different from the first direction, said first magneto resistive element being separated from said first and second wiring.

5. A semiconductor memory device according to claim 4, wherein said first magneto resistive element continues over a plurality of cells.

6. A semiconductor memory device according to claim 4, wherein said first magneto resistive element is divided in units of cells.

7. A semiconductor memory device according to claim 4, further comprising third wiring which is separated from said second wiring, extends in the second direction, and is connected to said first magneto resistive element.

8. A semiconductor memory device according to claim 1, further comprising:
   first wiring which is separated from said semiconductor substrate and extends in a first direction;
   second wiring which is separated from said first wiring and extends in a second direction different from the first direction; and
   fourth wiring which is formed away from said second wiring with a first space therebetween, is separated from said first wiring, and extends in the second direction, said first magneto resistive element being formed in the first space away from said first, second, and fourth wiring.

9. A semiconductor memory device according to claim 8, wherein said first magneto resistive element continues over a plurality of cells.

10. A semiconductor memory device according to claim 8, wherein said first magneto resistive element is divided in units of cells.

11. A semiconductor memory device according to claim 8, further comprising third wiring which is separated from said second wiring, extends in the second direction, and is connected to said first magneto resistive element.

12. A semiconductor memory device according to claim 1, further comprising:
    first wiring which is separated from said semiconductor substrate and extends in a first direction;
    second wiring which is separated from said first wiring and extends in a second direction different from the first direction;
    fourth wiring which is formed away from said second wiring with a first space therebetween, is separated from said first wiring, and extends in the second direction, said first magneto resistive element being formed in the first space away from said first, second, and fourth wiring; and
    a second magneto resistive element which is formed in the first space away from said first, second, and fourth wiring and from said first magneto resistive element, and comprising a second magnetic layer and a second nonmagnetic layer, said second magnetic layer and said second nonmagnetic layer being formed in a direction perpendicular to said semiconductor substrate.

13. A semiconductor memory device according to claim 12, wherein said first and second magneto resistive elements continue over a plurality of cells.

14. A semiconductor memory device according to claim 12, wherein said first and second magneto resistive elements are divided in units of cells.

15. A semiconductor memory device according to claim 12, wherein a first stacked structure comprising said first magnetic layer and said first nonmagnetic layer and a second stacked structure comprising said second magnetic layer and said second nonmagnetic layer are axially symmetrical with respect to the boundary between said first and second magneto resistive elements.

16. A semiconductor memory device according to claim 12, further comprising third wiring which is separated from said second wiring, extends in the second direction, and is connected to said first magneto resistive element.

17. A semiconductor memory device according to claim 12, further comprising a contact formed between said first and second magneto resistive elements to connect said first and second magneto resistive elements to said first wiring.

18. A semiconductor memory device according to claim 17, wherein at least said first and second magneto resistive elements or said contact continues over a plurality of cells.

19. A semiconductor memory device according to claim 17, wherein at least said first and second magneto resistive elements or said contact is divided in units of cells.

20. A semiconductor memory device according to claim 1, further comprising:
    first wiring which is separated from said semiconductor substrate and extends in a first direction;
    second wiring which is formed above and away from said first wiring, and extends in a second direction different from the first direction;
    fourth wiring which is formed away from said second wiring with a first space therebetween, is formed above and away from said first wiring, and extends in the second direction, said first magneto resistive element being formed in the first space away from said first, second, and fourth wiring;
    a second magneto resistive element which is formed in the first space away from said first, second, and fourth wiring and from said first magneto resistive element, is formed above said first wiring, and comprising a second magnetic layer and a second nonmagnetic layer, said second magnetic layer and said second nonmagnetic layer being formed in a direction perpendicular to said semiconductor substrate; and
    fifth wiring which is formed away from said fourth wiring with a second space narrower than the first space therebetween, is formed above and away from said first wiring, and extends in the second direction.

21. A semiconductor memory device according to claim 20, wherein said first and second magneto resistive elements continue over a plurality of cells.

22. A semiconductor memory device according to claim 20, wherein said first and second magneto resistive elements are divided in units of cells.

23. A semiconductor memory device according to claim 20, further comprising third wiring which is separated from said second wiring, extends in the second direction, and is connected to said first magneto resistive element.

24. A semiconductor memory device according to claim 20, wherein a first stacked structure comprising said first magnetic layer and said first nonmagnetic layer and a second stacked structure comprising said second magnetic layer and said second nonmagnetic layer are axially symmetrical with respect to the boundary between said first and second magneto resistive elements.

25. A semiconductor memory device according to claim 20, further comprising a contact formed between said first and second magneto resistive elements to connect said first and second magneto resistive elements to said first wiring.

26. A semiconductor memory device according to claim 25, wherein at least said first and second magneto resistive elements or said contact continues over a plurality of cells.

27. A semiconductor memory device according to claim 25, wherein at least said first and second magneto resistive elements or said contact is divided in units of cells.

28. A semiconductor memory device according to claim 20, wherein the first and second spaces alternately exist on the same level.

29. A semiconductor memory device according to claim 1, wherein said first magneto resistive element is a TMR element in which said first nonmagnetic layer is a tunnel junction layer.

30. A semiconductor memory device according to claim 1, wherein
    said first magneto resistive element is a TMR element in which said first nonmagnetic layer is a tunnel junction layer, and
    said TMR element comprises a single tunnel junction structure including one tunnel junction layer, or a double tunnel junction structure including two tunnel junction layers.

* * * * *